US007977776B2

(12) United States Patent
Galera et al.

(10) Patent No.: US 7,977,776 B2
(45) Date of Patent: Jul. 12, 2011

(54) MULTICHIP DISCRETE PACKAGE (75) Inventors: Manolito Fabres Galera, Singapore (SG); Leocadio Morona Alabin, Singapore (SG)

(73) Assignee: Fairchild Semiconductor Corporation, South Portland, ME (US)

( * ) Notice: Subject to any disclaimer, the term of this patent is extended or adjusted under 35 U.S.C. 154(b) by 246 days.

(21) Appl. No.: 12/409,620

(22) Filed: Mar. 24, 2009

(65) Prior Publication Data

US 2010/0244211 A1 Sep. 30, 2010

(51) Int. Cl.
*H01L 23/495* (2006.01)
(52) U.S. Cl. ........................................ 257/675; 257/724
(58) Field of Classification Search .................. 257/675, 257/724
See application file for complete search history.

(56) References Cited

U.S. PATENT DOCUMENTS

| 5,049,973 A * | 9/1991 | Satriano et al. ............... 257/670 |
| 5,289,344 A * | 2/1994 | Gagnon et al. ................ 361/712 |
| 2009/0091010 A1* | 4/2009 | Calo et al. .................... 257/675 |

* cited by examiner

*Primary Examiner* — Phat X Cao
(74) *Attorney, Agent, or Firm* — Thomas R. FitzGerald, Esq.; Hiscock & Barclay, LLP (57) ABSTRACT A multichip discrete package with a leadframe having a plurality of leads and a first die attach pad (DAP), the first DAP having side portions that extend above the first DAP, a first discrete die bonded to the first DAP, at least a first wirebond which forms an electrical connections between the first discrete die and a first selected one of the plurality of leads, a metal plate attached to tops of the side portions forming a second DAP, a second discrete die bonded to the second DAP, at least a second wirebond which forms an electrical connections between the second discrete die and a second selected one of the leads; and encapsulating material formed around the first and second die and the first and second DAPs.

18 Claims, 8 Drawing Sheets

MULTICHIP DISCRETE PACKAGE

FIELD OF THE INVENTION

This invention relates to semiconductor packages, and more particularly to a semiconductor packages for multiple discrete devices.

BACKGROUND OF THE INVENTION

Multiple die packages provide higher density circuitry than single die packages, and therefore there is a strong incentive to combine circuit elements in a single package. As there are at least two die in a package and a wide range of circuit elements together with a large array of package types, the design of a market acceptable multiple die package is competitive, and there is a constant effort to design a multiple die package that has marketing advantages over conventional multiple die packages.

SUMMARY OF THE INVENTION

The invention comprises, in one form thereof, a multichip discrete package comprising a leadframe having a plurality of leads and a first die attach pad (DAP), the first DAP having side portions that extend above the first DAP, a first discrete die bonded to the first DAP, at least a first wirebond which forms an electrical connections between the first discrete die and a first selected one of the plurality of leads, a metal plate attached to tops of the side portions forming a second DAP, a second discrete die bonded to the second DAP, at least a second wirebond which forms an electrical connections between the second discrete die and a second selected one of the leads; and encapsulating material formed around the first and second die and the first and second DAPs.

In still another form, the invention includes a method for packaging multiple discrete die. The method comprises the steps of providing a leadframe having a plurality of leads and a first die attach pad (DAP), the first DAP having side portions that extend above the first DAP, bonding a first die to the first DAP, attaching at least a first wire bond between the first die and a first selected one of the plurality of leads, attaching a metal plate to tops of the side portions to thereby form a second DAP, bonding a second die to the second DAP, attaching at least a second wire bond between the second die and a second selected one of the plurality of leads; and molding encapsulating material around the first and second die and the first and second DAPs.

BRIEF DESCRIPTION OF THE DRAWINGS

The aforementioned and other features, characteristics, advantages, and the invention in general will be better understood from the following more detailed description taken in conjunction with the accompanying drawings, in which.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Figure 1:
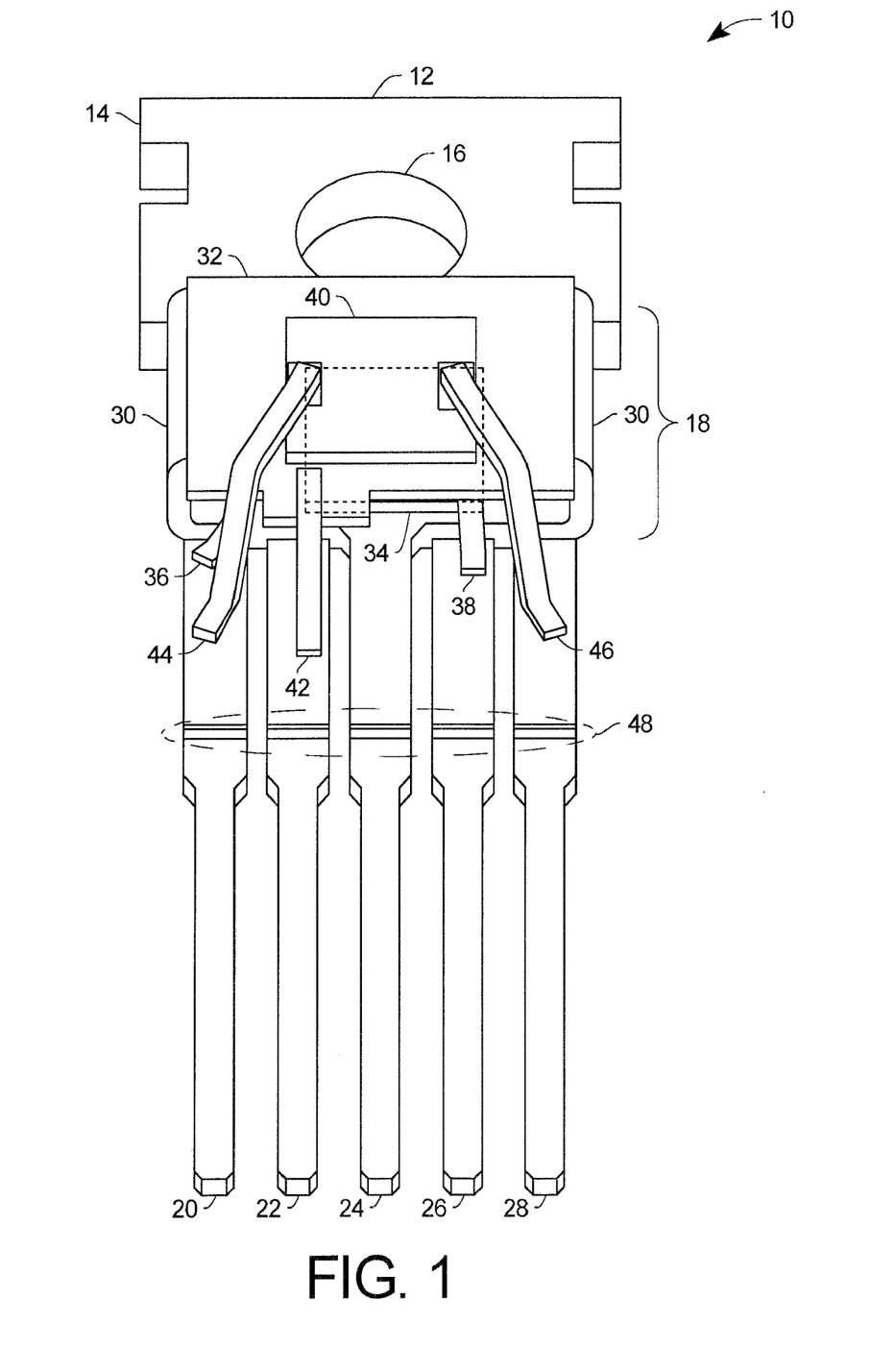
FIG. 1 is an isometric view of a multichip discrete package without encapsulating material according to one embodiment of the present invention.

Turning now to the drawings, FIG. 1 is an isometric view of a multichip discrete package 10 without encapsulating material according to one embodiment of the present invention. The multichip discrete package 10 includes a leadframe 12, which may be copper and which is similar to a TO-220 package, having a heatsink tab 14, a mounting hole 16, and a die bonding area 18. The leadframe 12 has five leads 20, 22, 24, 26, and 28. Lead 24 is integral with the die bonding area 18, and leads 20, 22, 26, and 28 are isolated from the die bonding area 18. The leadframe 12 has a die bonding area 18 is comparable to standard TO-220 packages which means that the pitch of the leads 20-28 is reduced, but it is still within the capabilities of the industry. As a result two or more discrete die can be placed in a multichip discrete package 10 which uses approximately the same amount of metal as a conventional TO-220 package.

The die bonding area 18 has curved upward extending side portions 30 with a planar upper die attachment pad (DAP) 32 attached to the tops of the side portions 30. A lower discrete semiconductor die 34 is die bonded to the die bonding area 18 between the two side portions 30, with wirebonds 36 and 38 electrically connecting leads 20 and 26, respectively, to the lower die 34. The side portions 30 are formed using industry standard methods of making leadframes which include a stamping process to cut the metal leadframe and also form the downset and other features required of the leadframe.

An upper discrete semiconductor die 40 is die bonded to the upper DAP 32 with a wirebond 42 electrically connecting the lead 22 to the upper DAP 32, and wirebonds 44 and 46 electrically connecting leads 22 and 28, respectively, to the upper die 40. The leads 20-28 have vertical lateral stepped regions 48 so that the ends of the leads 20-28 farthest from the metal tab 14 are in a plane which is about half the height of the completed multichip discrete package 10 and the other ends of the leads 20-28 are in the same plane as a lower die bonding pad (DAP) 50 (shown in FIG. 2) which lies between the side portions 30. Those skilled in the art will appreciate that the wire bonds between the upper and lower dies 34, 40 and the leads 20-28 can have different embodiments resulting in different connections between the dies 34, 40 and the leads 20-28.

Figure 2:
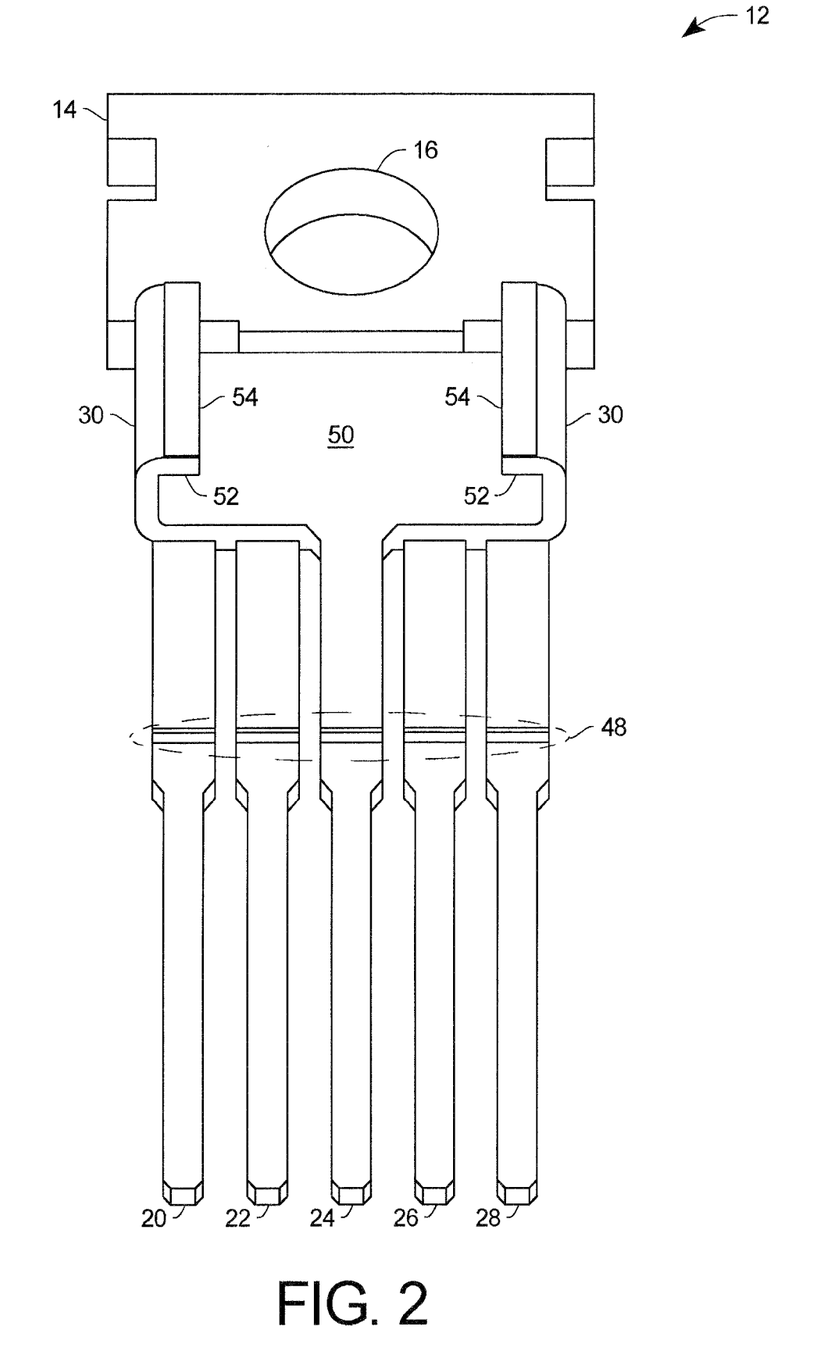
FIG. 2 is an isometric view of the leadframe shown in FIG. 1.

FIG. 2 is an isometric view of the leadframe 12 shown in FIG. 1. As shown in FIG. 2 the side portions 30 have an upper lip 52 that is pre-taped with high temperature adhesive 54 in one embodiment of the invention. The high temperature adhesive 54 may be in the form of a polyimide tape, and may be electrically conductive or non-conductive depending of the desired electrical connections to the lower DAP 50 and the upper DAP 32.

Figure 3:
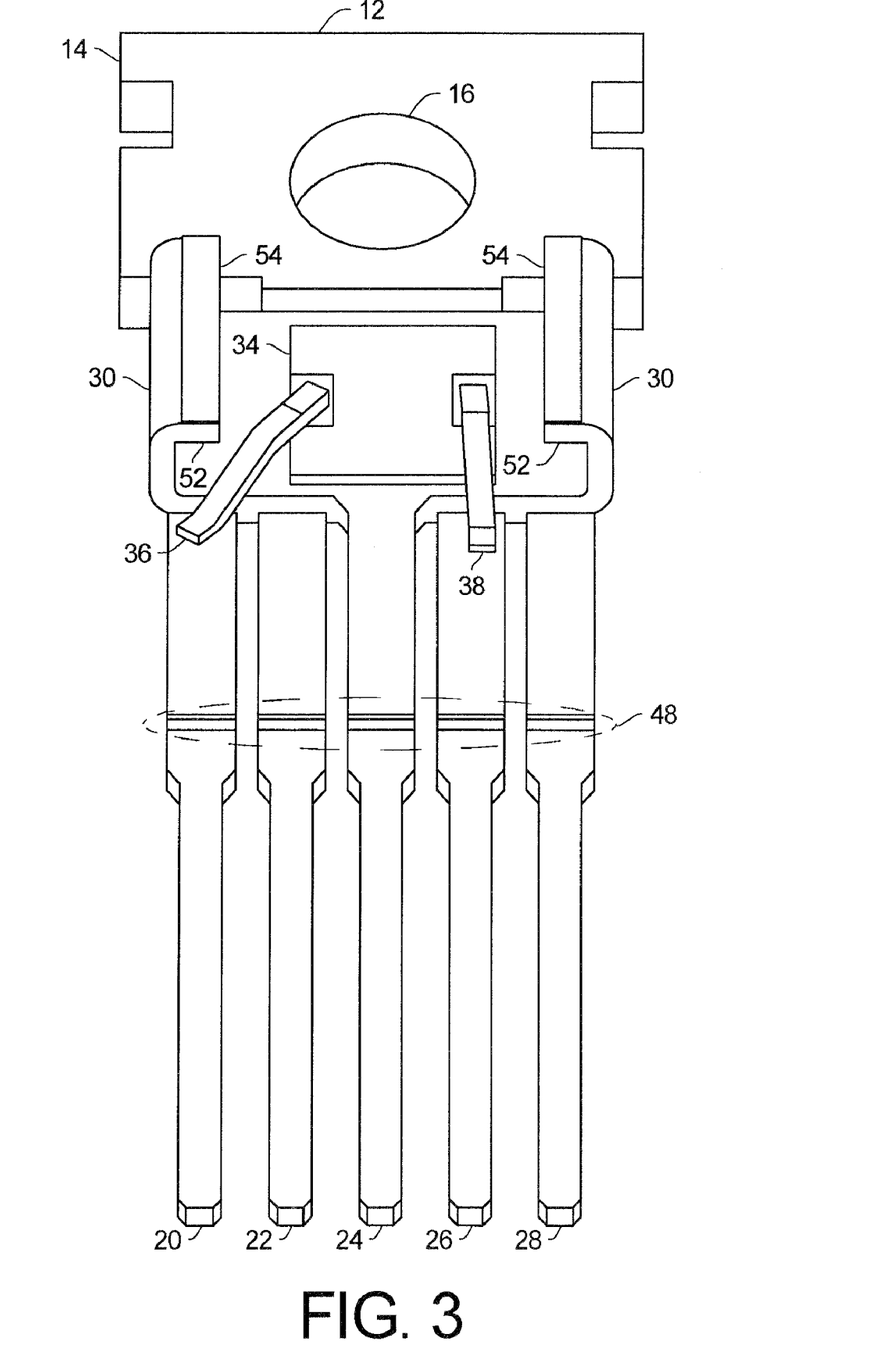
FIG. 3 is an isometric view of FIG. 2 with the addition of a lower discrete semiconductor die bonded to the leadframe and two wirebonds from the semiconductor die to two leads of the leadframe.

FIG. 3 is an isometric view of FIG. 2 with the addition of the lower discrete semiconductor die 34 bonded to the leadframe 12 and two wirebonds 36, 38 from the semiconductor die 34 to leads 20 and 26, respectively, of the leadframe 12. The upper DAP 32, the upper die 40, and the wirebonds 42, 44, and 46 are added to the assembly of FIG. 3 to form the discrete semiconductor package 10 shown in FIG. 1.

Figure 4A:
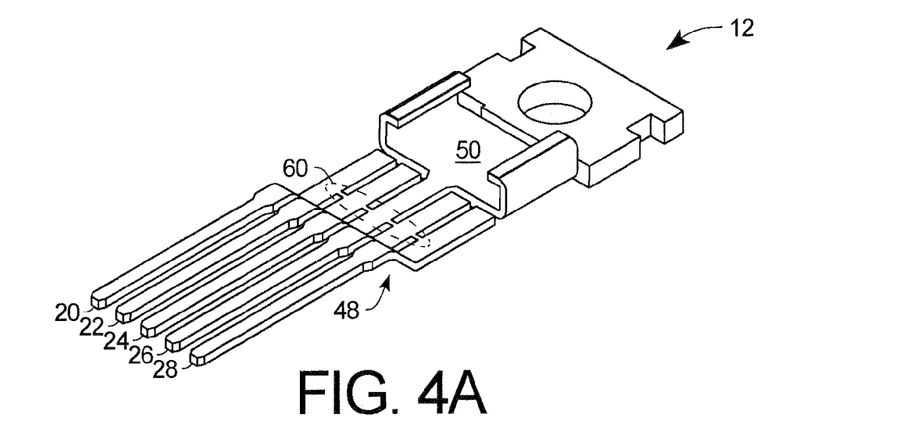
FIGS. 4A, 4B, 4C, 4D, 4E, and 4F are isometric views of the multichip discrete package shown in FIG. 1 at selected manufacturing stages of one method of making the multichip discrete package.
Figure 4B:
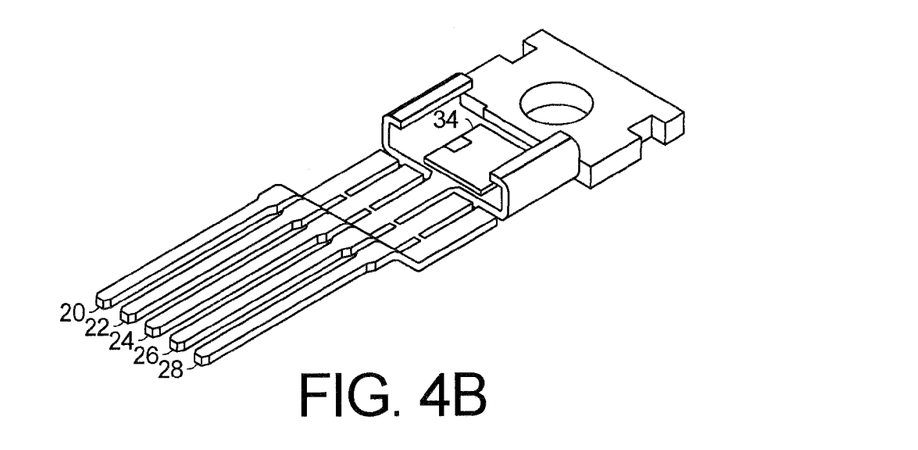
Figure 4C:
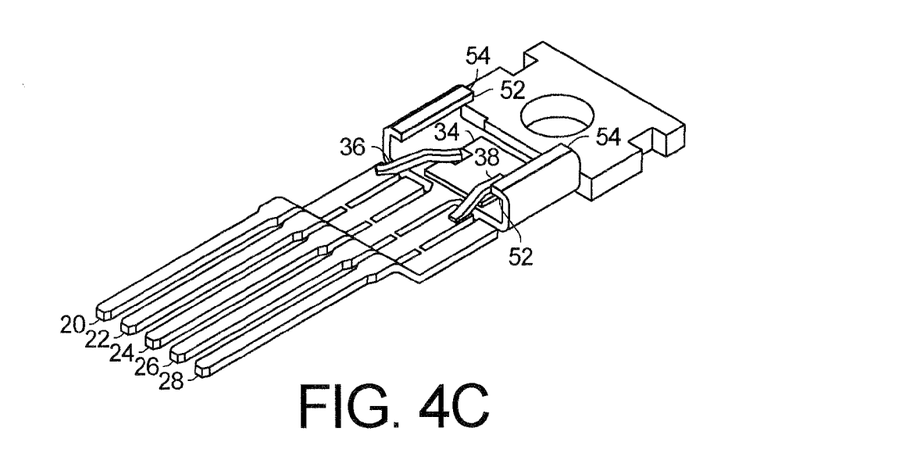
Figure 4D:
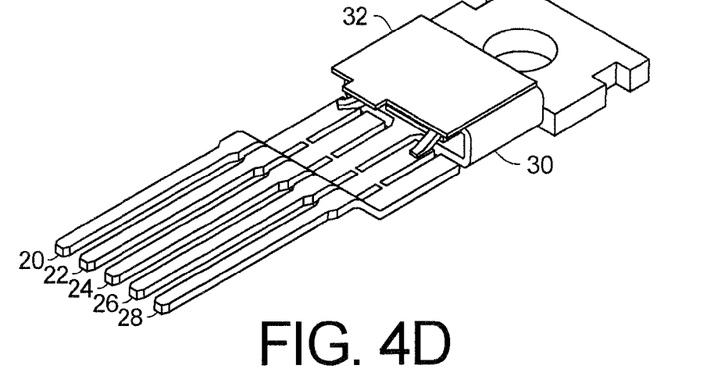
Figure 4E:
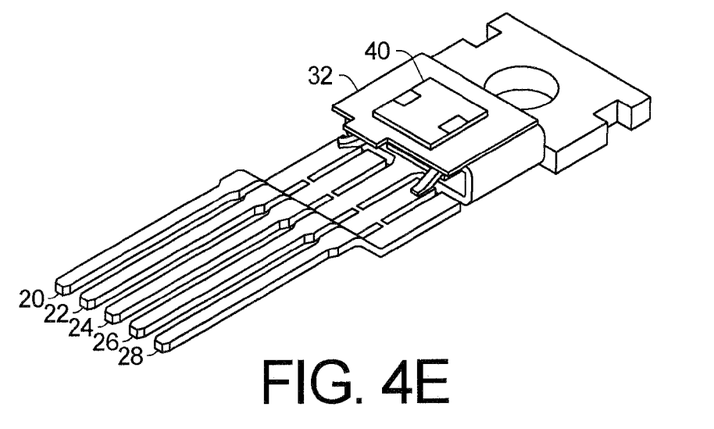
Figure 4F:
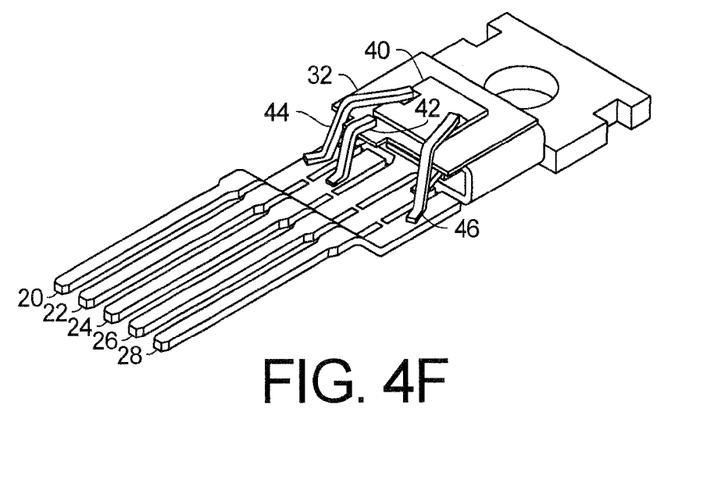

FIGS. 4A, 4B, 4C, 4D, 4E, and 4F are isometric views of the multichip discrete package 10 shown in FIG. 1 at selected manufacturing stages of one method of making the multichip discrete package 10. FIG. 4A shows the leadframe 12 of FIG. 2 but with tie bars 60 between adjacent leads 20-28 which are removed in a later processing step. The lower die 34 has been attached in FIG. 4B to the DAP 50 of the leadframe. The die 34 can be die bonded with solder paste, soft solder, or a silver filled epoxy, which is first applied to the DAP 50 before the die 34 is mounted, followed by a solder reflow process or an epoxy curing process. Then wirebonds 36 and 38, which may be aluminum or gold, are attached to wire bond pads on the lower die 34 and leads 20 and 26, respectively, as shown in FIG. 4C. FIG. 4D shows the assembly of FIG. 4C after the upper DAP 32 is attached to the upper lips 52 of the side portions 30 of the leadframe 12 using a heat treatment to secure the DAP 32 to the high temperature adhesive 54. The die 40 is attached to the upper DAP 32 as the die 34 is attached to the lower DAP 50 except that if a soft solder is used, the die 40 is die bonded to the upper DAP 32 before the upper DAP 32 is bonded to the leadframe. The upper die 40 is die bonded to the DAP 32 (FIG. 4E), and wire bonds 42, 44, and 46 formed between the wire bonding pads on the upper die 40 and leads 22, 20, and 28, respectively, as shown in FIG. 4F.

Figure 4G:
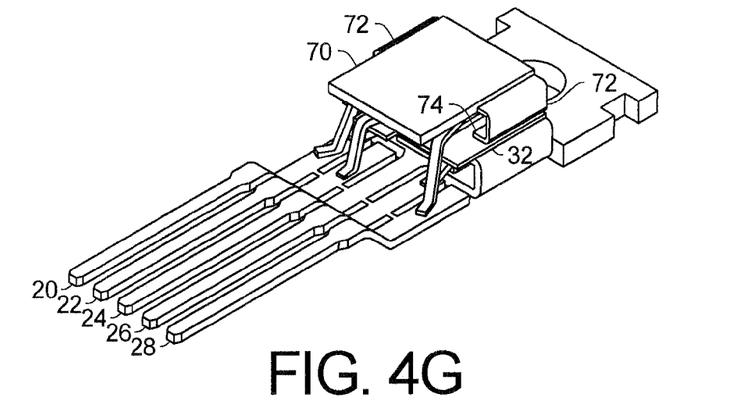
FIG. 4G is an isometric view of the assembly shown in FIG. F with the addition of a heatspreader.

An alternate embodiment of the present invention is shown in FIG. 4G which includes a heatspreader 70 attached to the top of the plate of the DAP 32. The heatspreader 70 has downward curving side portions 72, the lower ends of which have been formed into horizontal flats or lips 74 which attach to the top of the plate of the DAP 32.

Figure 4H:
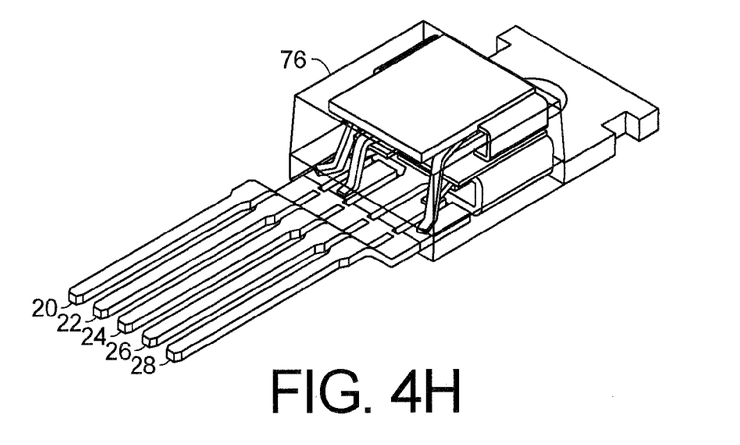
FIG. 4H is an isometric view of the assembly shown in FIG. 4G with the addition of encapsulation material shown in outline.
Figure 4I:
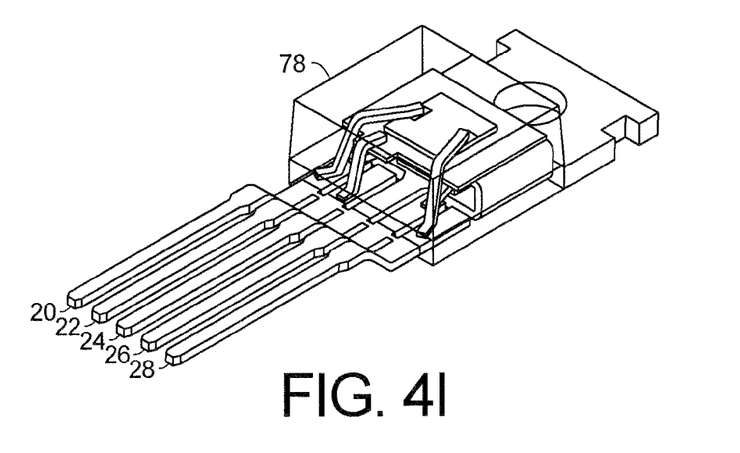
FIG. 4I is an isometric view of the assembly shown in FIG. 4F with the addition of encapsulation material shown in outline.

FIG. 4H is an isometric view of the multichip discrete assembly shown in FIG. 4G after a molding operation using encapsulation material 76 shown in outline, and FIG. 4I is an isometric view of the assembly shown in FIG. 4F with the addition of encapsulation material 78 shown in outline. In FIG. 4H the top of the heatspreader 70 is not encapsulated. Following the molding operation the assembly is plated, trimmed, singulated, and tested.

Figure 5:
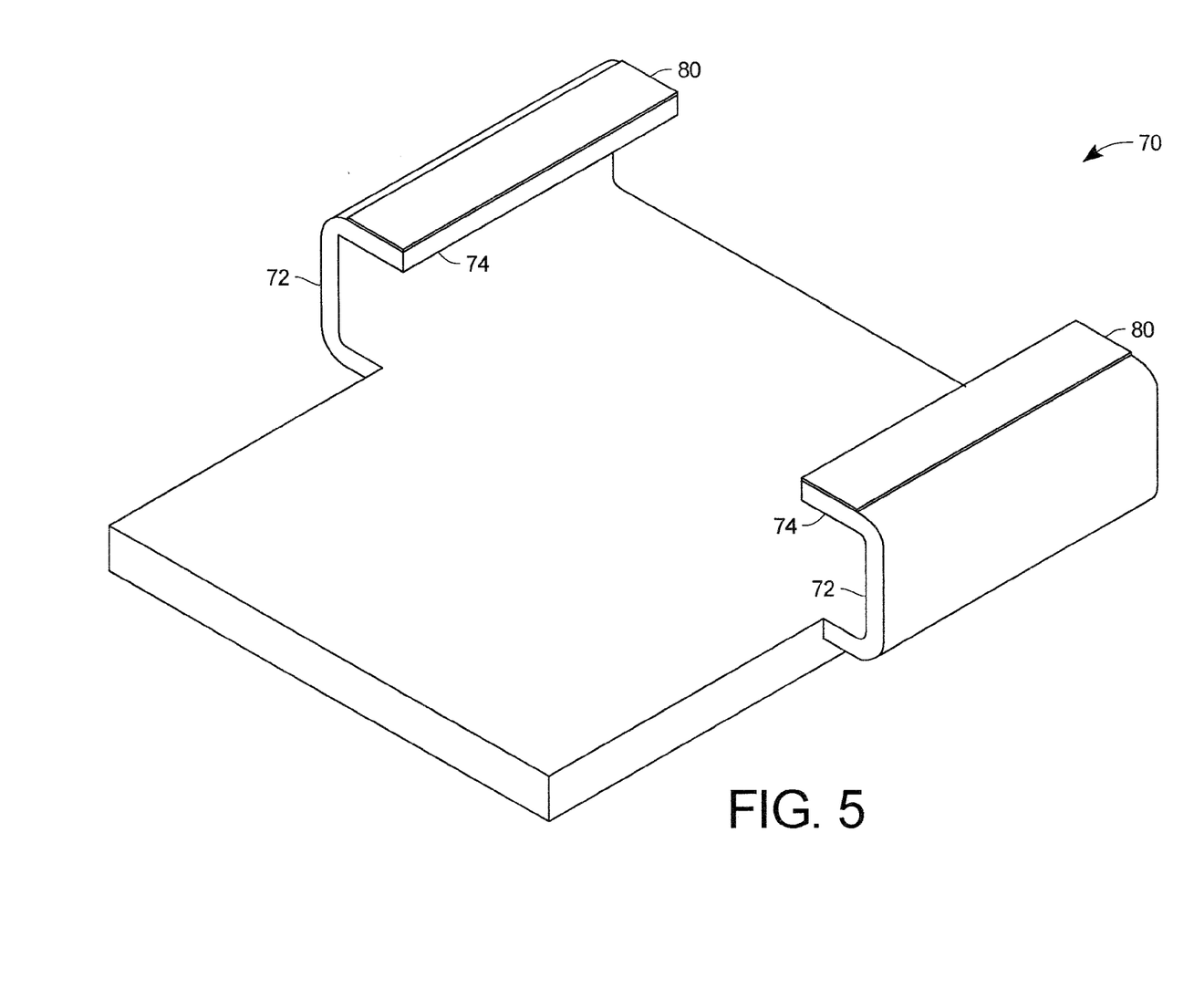
FIG. 5 is a bottom perspective view of the heatspreader shown in FIGS. 4G and 4H.

FIG. 5 is a bottom perspective view of the heatspreader 70 shown in FIGS. 4G and 4I. The lower lips 74 of the heatspreader 70 have a high temperature adhesive 80 attached to them. The high temperature adhesive 80 is used to attach the heatspreader 70 to the plate of the DAP 32 as shown in FIGS. 4G and 4H.

Figure 6:
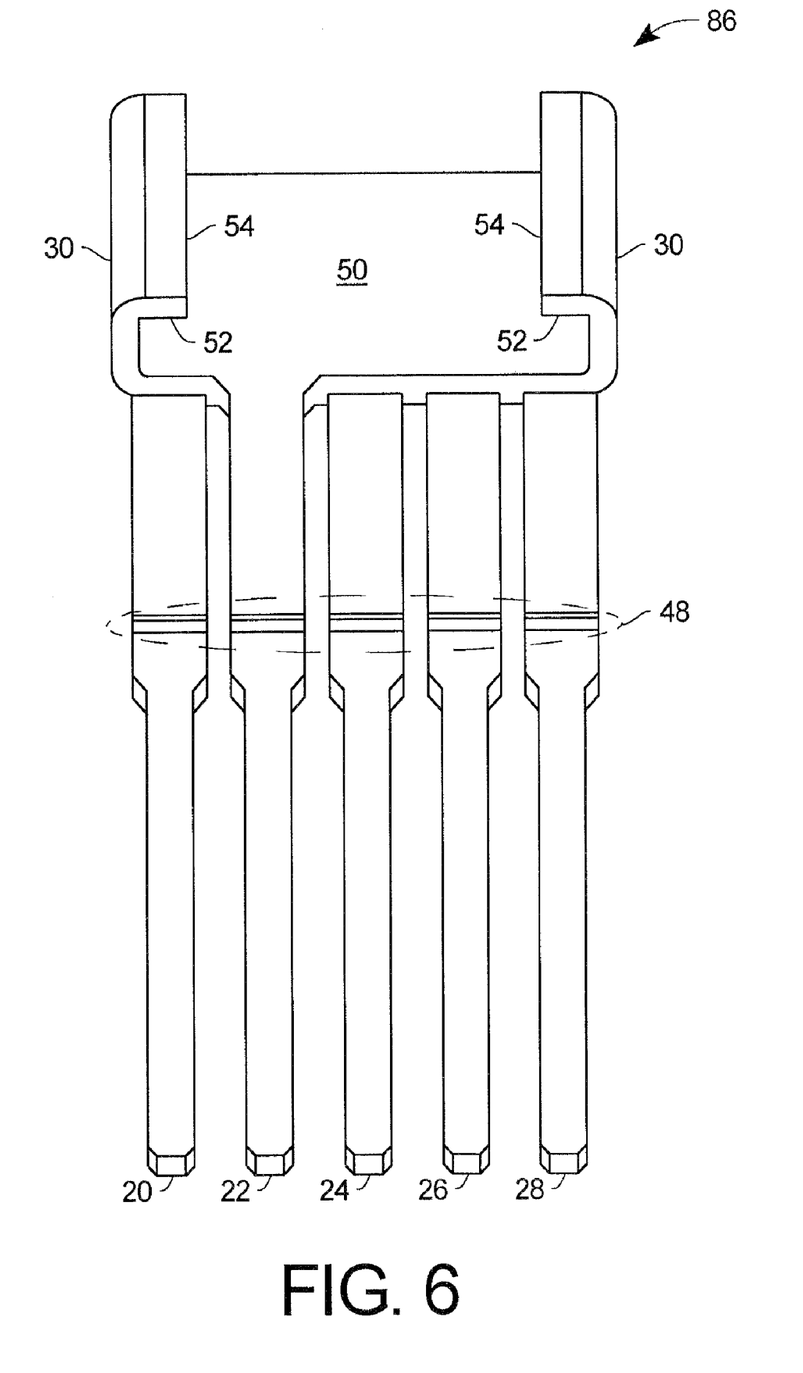
FIG. 6 is an isometric view of an alternative embodiment of the leadframe shown in FIG. 2.

FIG. 6 is an isometric view of a leadframe 86 which is an alternative embodiment of the leadframe 12 shown in FIG. 2. The leadframe 86 does not have the heatsink tab 14 shown in FIG. 2, and lead 24 is isolated from the DAP 50, while lead 22 is integral with the DAP 50.

The multichip discrete package 10 provides a circuit assembly that can be used in many applications such as in differential amplifiers and dual MOSFET or bipolar driver stages. For example, the lower and upper dies 34, 40 may be bipolar transistors with collector connections to the substrates of the dies 34, 40. A bipolar differential amplifier could be realized in the multichip discrete package 10 shown in FIG. 1 the emitters of dies 34 and 40 electrically connected to lead 20, the base of die 34 electrically connected to lead 26, and the base of die 40 electrically connected to lead 28.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A multichip discrete package comprising:
    a) a leadframe having a plurality of leads and a first die attach pad (DAP), said first DAP having side portions that extend above said first DAP;
    b) a first discrete die bonded to said first DAP;
    c) at least a first wirebond which forms an electrical connections between said first discrete die and a first selected one of said plurality of leads;
    d) a metal plate attached to tops of said side portions forming a second DAP;
    e) a second discrete die bonded to said second DAP;
    f) at least a second wirebond which forms an electrical connections between said second discrete die and a second selected one of said leads; and
    g) encapsulating material formed around said first and second die and said first and second DAPs.

2. The multichip discrete package set forth in claim 1 further including a heatspreader having side portions attached to a top of said metal plate.

3. The multichip discrete package set forth in claim 2 wherein a top of said heatspreader is not encapsulated.

4. The multichip discrete package set forth in claim 1 wherein said leadframe has a heatsink tab.

5. The multichip discrete package set forth in claim 1 wherein said first DAP is integral with one of said plurality of leads.

6. The multichip discrete package set forth in claim 1 wherein said metal plate is attached to said side portions with a high temperature adhesive.

7. The multichip discrete package set forth in claim 2 wherein said heat spreader is attached to said metal plate with a high temperature adhesive.

8. The multichip discrete package set forth in claim 1 wherein said first selected one of said plurality of leads and said second selected one of said plurality of leads is the same lead.

9. The multichip discrete package set forth in claim 1 wherein each of said plurality of leads has two portions which lie is two parallel planes.

10. A method of packaging multiple discrete die comprising the steps of:
    a) providing a leadframe having a plurality of leads and a first die attach pad (DAP), said first DAP having side portions that extend above said first DAP;
    b) bonding a first die to said first DAP;
    c) attaching at least a first wire bond between said first die and a first selected one of said plurality of leads;
    d) attaching a metal plate to tops of said side portions to thereby form a second DAP;
    e) bonding a second die to said second DAP;

f) attaching at least a second wire bond between said second die and a second selected one of said plurality of leads; and g) molding encapsulating material around said first and second die and said first and second DAPs.

11. The method set forth in claim 10 further including the step of attaching a heatspreader having side portions to a top of said metal plate.

12. The method set forth in claim 11 wherein a top of said heatspreader is not encapsulated.

13. The method set forth in claim 11 wherein said leadframe has a heatsink tab.

14. The method set forth in claim 10 wherein said first DAP is integral with one of said plurality of leads.

15. The method set forth in claim 10 wherein said metal plate is attached to said side portions with a high temperature adhesive.

16. The method set forth in claim 11 wherein said heat spreader is attached to said metal plate with a high temperature adhesive.

17. The method set forth in claim 10 wherein said first selected one of said plurality of leads and said second selected one of said plurality of leads is the same lead.

18. The method set forth in claim 10 wherein each of said plurality of leads has two portions which lie is two parallel planes.

* * * * *